(12) United States Patent
Sawada et al.

(10) Patent No.: US 9,293,166 B2
(45) Date of Patent: Mar. 22, 2016

(54) SPUTTERING TARGET MATERIAL FOR PRODUCING INTERMEDIATE LAYER FILM OF PERPENDICULAR MAGNETIC RECORDING MEDIUM AND THIN FILM PRODUCED BY USING THE SAME

(75) Inventors: Toshiyuki Sawada, Himeji (JP); Atsushi Kishida, Himeji (JP); Akihiko Yanagitani, Himeji (JP)

(73) Assignee: Sanyo Special Steel Co., Ltd., Hyogo-ken (JP)

( * ) Notice: Subject to any disclaimer, the term of this patent is extended or adjusted under 35 U.S.C. 154(b) by 257 days.

(21) Appl. No.: 12/934,387

(22) PCT Filed: Apr. 30, 2009

(86) PCT No.: PCT/JP2009/058465
§ 371 (c)(1),
(2), (4) Date: Sep. 24, 2010

(87) PCT Pub. No.: WO2009/133921
PCT Pub. Date: Nov. 5, 2009

(65) Prior Publication Data
US 2011/0020169 A1    Jan. 27, 2011

(30) Foreign Application Priority Data

Apr. 30, 2008 (JP) ................................. 2008-118113
Jul. 23, 2008 (JP) ................................. 2008-189853

(51) Int. Cl.
| | |
|---|---|
| C23C 14/34 | (2006.01) |
| G11B 5/667 | (2006.01) |
| C22C 1/04 | (2006.01) |
| C22C 19/03 | (2006.01) |
| C22C 19/05 | (2006.01) |
| G11B 5/84 | (2006.01) |
| G11B 5/851 | (2006.01) |

(52) U.S. Cl.
CPC .............. *G11B 5/667* (2013.01); *C22C 1/0433* (2013.01); *C22C 19/03* (2013.01); *C22C 19/058* (2013.01); *C23C 14/3414* (2013.01); *G11B 5/8404* (2013.01); *G11B 5/851* (2013.01)

(58) Field of Classification Search
CPC .................................. C23C 14/34; G11B 5/66
USPC ...................................... 420/441; 204/298.13
See application file for complete search history.

(56) References Cited

U.S. PATENT DOCUMENTS

| | | | | |
|---|---|---|---|---|
| 4,079,164 | A | * | 3/1978 | Misumi .......................... 428/353 |
| 4,208,208 | A | * | 6/1980 | Misumi et al. ................. 420/441 |
| 8,088,504 | B2 | * | 1/2012 | Shimizu ......................... 428/831 |
| 2008/0131735 | A1 | * | 6/2008 | Das et al. ....................... 428/831 |

FOREIGN PATENT DOCUMENTS

| | | |
|---|---|---|
| CN | 102016110 B | 9/2013 |
| JP | 6240363 A | 2/1987 |
| JP | 7292463 A | 11/1995 |
| JP | 10324978 A | 12/1998 |
| JP | 10333137 A * | 12/1998 |
| JP | 2000169923 A | 6/2000 |
| JP | 2000309865 A | 11/2000 |
| JP | 2001342561 A | 12/2001 |

OTHER PUBLICATIONS

NPL: Machine translation of JP07292463A, Nov. 1995.*
NPL: English abstract of JP-10333137A, Dec. 1998.*
NPL: http://en.wikipedia.org/wiki/Sputter_depositiondown-load on Nov. 20, 2013.*
NPL: Las Positas College, Vacuum Technology 60A & 60B, p. 191, Fall 2002.*
Takenoiri et al., "Structural Control Method for Perpendicular Magnetic Recording Film," Fuji Jiho, 2004 3 pp. plus English-language Abstract, vol. 77, No. 2.

* cited by examiner

*Primary Examiner* — Jie Yang
(74) *Attorney, Agent, or Firm* — The Webb Law Firm

(57) ABSTRACT

There is disclosed a sputtering target material for producing an intermediate layer film of a perpendicular magnetic recording medium, which is capable of dramatically reducing the crystal grain size of a thin film formed by sputtering. The sputtering target material comprises, in at %, 1 to 20% of W; 0.1 to 10% in total of one or more elements selected from the group consisting of P, Zr, Si and B; and balance Ni.

2 Claims, No Drawings

SPUTTERING TARGET MATERIAL FOR PRODUCING INTERMEDIATE LAYER FILM OF PERPENDICULAR MAGNETIC RECORDING MEDIUM AND THIN FILM PRODUCED BY USING THE SAME

CROSS REFERENCE TO RELATED APPLICATIONS

This application claims priority to Japanese Patent Application No. 2008-118113 filed Apr. 30, 2008, and Japanese Patent Application No. 2008-189853 filed Jul. 23, 2008, the entire disclosures of both of which are incorporated herein by reference.

TECHNICAL FIELD

The present invention relates to a sputtering target material for producing an intermediate layer film of a perpendicular magnetic recording medium containing Ni—W as a main component and a thin film produced by using the same. More particularly, the present invention relates to a Ni—W—P, Zr-based or Ni—W—(Si, B)-based sputtering target material for an intermediate layer film, and a thin film produced by using the same.

BACKGROUND ART

In recent years, accompanied by remarkable progress of magnetic recording technology, recording density of the magnetic recording medium is becoming higher due to increase in the drive capacity. However, for the magnetic recording medium with a longitudinal magnetic recording system which is widely used currently, an attempt to realize the high recording density makes the recording bit to be miniaturized, which requires such a high coercive force to the extent that makes the recording with the recording bit impossible. Therefore, a perpendicular magnetic recording system is being investigated as a means for solving these problems and increasing the recording density.

In the perpendicular magnetic recording system, the axis of easy magnetization is formed to be oriented perpendicularly to the medium surface in the magnetic film of the perpendicular magnetic recording medium and this system is suitable for high recording density. In the perpendicular magnetic recording system, a multi-layer recording medium having a magnetic recording film layer with an elevated recording sensitivity, a soft magnetic film layer and an intermediate layer has been developed. A CoCrPt—$SiO_2$-based alloy is commonly used for this magnetic recording film layer, while a Co—Zr—Nb-based alloy and the like are used for the soft magnetic film layer. The intermediate layer described herein refers generally to a layer provided for the purpose of reducing the size of the crystal grain of the magnetic recording film layer and imparting anisotropy to the crystal orientation.

As the intermediate layer, a variety of Ni-based alloys, Ta-based alloys, Pd-based alloys, Ru-based alloys, and so on have been proposed and recently a Ni—W-based alloy has also been used. One of the roles of these intermediate layers is to control the structure of the magnetic recording film layer. For this purpose, it is said that reducing the size of the crystal grain of the intermediate layer is important. For example, an example of a Ru intermediate layer has been proposed as disclosed in "Structure Control of Perpendicular Magnetic Recording Film" (Fuji Jiho, Vol. 77, No. 2, 2004, p. 121).

In addition, it is considered that, in the Ni—W-based alloy, the recording density is good if the lattice constant of the thin film is in a range of about 3.53 to 3.61 ($\times 10^{-10}$ m), although the detailed reason is not known.

Although good recording properties can be obtained if a perpendicular magnetic recording medium is produced by using the Ni—W-based thin film as the intermediate layer, it is required to reduce the size of the crystal grain of the Ni—W-based intermediate layer in order to realize much higher recording density. Nevertheless, there is no common knowledge at all regarding the element and the like to be added which may contribute to reducing the size of the crystal grain of the Ni—W-based thin film.

SUMMARY OF INVENTION

The present inventors have currently found that the size of the crystal grain of the thin film formed by sputtering can be dramatically reduced by structuring the sputtering target material by adding a predetermined amount of one or more elements selected from a group consisting of P, Zr, Si and B, to the Ni—W binary component.

Accordingly, it is an object of the present invention to provide a sputtering target material for producing an intermediate layer film of a perpendicular magnetic recording medium, wherein the sputtering target material is capable of dramatically reducing the size of the crystal grain of the thin film formed by sputtering.

According to the present invention, there is provided a sputtering target material for producing an intermediate layer film of a perpendicular magnetic recording medium, comprising, in at %, 1 to 20% of W; 0.1 to 10% in total of one or more elements selected from the group consisting of P, Zr, Si and B; and balance Ni, and preferably consisting of these components, and a thin film produced by using the material.

According to the first embodiment of the present invention, there is provided a sputtering target material for producing the intermediate layer film of the perpendicular magnetic recording medium, comprising, in at %, 1 to 20% of W; 0.1 to 10% in total of P and/or Zr; and balance Ni, and preferably consisting of these components, and a Ni—W—P, Zr-based thin film produced by using the material.

According to the second embodiment of the present invention, there is provided a sputtering target material for producing the intermediate layer film of the perpendicular magnetic recording medium, comprising, in at %, 1 to 20% of W; 0.1 to 10% in total of Si and B; and balance Ni, and preferably consisting of these components, and a Ni—W—(Si, B)-based thin film produced by using the material.

DESCRIPTION OF EMBODIMENTS

Sputtering Target Material According to the First Embodiment

According to the first embodiment of the present invention, there is provided a sputtering target material containing, in at %, 1 to 20% of W; 0.1 to 10% in total of P and/or Zr; and balance Ni, and preferably consists of these components. Specifically, the content of W is, in at %, 1 to 20%, and preferably 5 to 15%. If the content of W is less than 1%, the lattice constant of the sputtered thin film is less than 3.53 ($\times 10^{-10}$ m) and if the content of W exceeds 20%, the lattice constant exceeds 3.61 ($\times 10^{-10}$ m), both of which result in decrease of the recording density.

The total content of P and/or Zr is 0.1 to 10.0%, and preferably 0.3 to 5%. It is undesirable if the total content of P and/or Zr is less than 0.1% because there is no effect of reducing the size of the crystal grain of the sputtered thin film, or if the total content of P and/or Zr exceeds 10.0% because the effect of reducing the crystal grain size becomes saturated, wherein a large amount of a compound with Ni is produced which is considered to adversely affect the structure control of the magnetic recording film layer, and a portion becomes amorphous.

As the raw material powder, gas atomized powder is preferable for the following reason. That is, P and Zr do not form a solid solution with Ni at all in a melting process with a low cooling rate such as casting and thus form a coarse crystalline compound. The presence of this coarse compound in the sputtering target material may cause some failures such as an abnormal electrical discharge and generation of a large number of particles upon sputtering. In contrast, if the raw material powder is produced by gas atomization process, a coarse crystalline compound is not formed because the powder is quenched and solidified during the gas atomization process. The sputtering target material consolidated by using this powder generates fewer particles.

Sputtering Target Material According to the Second Embodiment

According to the second embodiment of the present invention, there is provided a sputtering target material containing, in at %, 1 to 20% of W; 0.1 to 10% in total of Si and B; and balance Ni, and preferably consisting of these components. Specifically, the content of W is, in at %, 1 to 20%, and preferably 5 to 15%. If the content of W is less than 1%, the lattice constant of the sputtered thin film is less than 3.53 ($\times 10^{-10}$ m) and if the content of W exceeds 20%, the lattice constant exceeds 3.61 ($\times 10^{-10}$ m), both of which result in decrease of the recording density.

The total content of Si and B is 0.1 to 10.0%, and preferably 1.0 to 8%. It is undesirable if the total content of Si and B is less than 0.1% because there is no effect of reducing the size of the crystal grain of the sputtered thin film, or if the total content of Si and B exceeds 10.0% because the effect of reducing the crystal grain size becomes saturated. In addition, it is more preferable that the ratio of Si and B is 2:8 to 6:4, because the eutectic point of the alloy remarkably decreases and the effect of reducing the crystal grain size is extremely high.

As the raw material powder, gas atomized powder is preferable for the following reason. That is, Si and B hardly form a solid solution with Ni in a melting process with a low cooling rate and thus form a coarse crystalline Ni-based silicate or Ni-based borate. The presence of these coarse compounds in the sputtering target material may cause some failures such as an abnormal electrical discharge and generation of a large number of particles upon sputtering. In contrast, if the raw material powder is produced by gas atomization process, a coarse crystalline compound is not formed because the powder is quenched and solidified during the gas atomization process. The sputtering target material consolidated by using this powder generates fewer particles, which is more preferable.

Consolidation is preferably carried out at a temperature between 800 and 1250° C. for the following reason. That is, consolidation at a temperature lower than 800° C. results in low relative density of the sputtering target material. On the other hand, consolidation at a temperature higher than 1250° C. causes the expansion of the billet upon heating, although the detail is unknown, and the stable production is difficult. Therefore, the temperature range has been determined between 800 and 1250° C.

Example 1

The Ni—W—P, Zr-based alloy powder shown in Table 1 was prepared by gas atomization. Using this powder as the raw material powder, the powder-filled billet sealed in an SC can under evacuation was consolidated by the HIP method at 750 to 1100° C., and then machined to produce a sputtering target material of a Ni—W—P, Zr-based alloy. In addition, another sputtering target material of a Ni—W—P, Zr-based alloy was produced by a casting method for comparison.

The detail of the above-mentioned each step is as follows. First, 25 kg of the raw material was induction-melted in argon in an alumina crucible and tapped through the tapping nozzle with a diameter of 5 mm provided at the bottom of the crucible to produce a powder by Ar gas atomization at an atomization pressure of 0.7 MPa. The resultant Ni—W—P, Zr alloy powder was sealed in an SC can with an outer diameter of 205 mm, an inner diameter of 190 mm and a length of 300 mm under evacuation. The ultimate vacuum pressure at the evacuation was set at about $1.3 \times 10^{-2}$ Pa (about $1 \times 10^{-4}$ Torr). The above-mentioned powder-filled billet was consolidated by the HIP method at 750 to 1100° C. and 147 MPa.

The consolidated ingot produced as mentioned above was processed to a diameter of 76.2 mm×3 mm by wire cutting, lathe machining and flat surface polishing, followed by brazing with a copper backing plate to make a sputtering target material. In addition, as the casting method for comparison, 100 kg of the raw material was melted under vacuum and casted to a refractory body with a diameter of 200 mm, which was turned off to a diameter of 200 mm×100 mm, followed by hot forging at 800° C. to a height of 50 mm. The subsequent method to produce the sputtering target material was similar to the above-mentioned HIP method.

The items and methods of evaluation of the sputtering target material produced by the above-mentioned procedure were as follows. The sputtering target material prepared was sputtered onto an Si substrate with a diameter of 63.5 mm in order to evaluate the number of particles of the sputtered film. The sputtering conditions included the Ar pressure of 0.5 Pa, DC electric power of 500 W, and the film thickness of 500 nm. The number of particles generated under these conditions was measured. Note that the number of particles in Table 1 was expressed by the relative value to the number of particles of No. 1 which was taken as 100.

In addition, the lattice constant of the sputtered film was calculated from the diffraction peak of the X-ray diffraction of the above-mentioned sputtered film. The generation of the Ni-based compound was also confirmed and was evaluated as follows: Good: No Ni-based compound; Fair: A small amount of Ni-based compound generated or partially amorphous; Poor: A large amount of Ni-based compound generated or substantially amorphous.

In addition, the crystalline grain diameter of the sputtered film was measured by TEM observation of the cross section of the above-mentioned sputtered film. The diameter of a circle for the corresponding area was taken as the diameter of the crystalline grain by an image analysis. Note that the crystalline grain diameter in Table 1 was expressed by the relative value to the crystalline diameter of No. 1 which was taken as 100. Smaller value means a smaller crystalline grain diameter.

TABLE 1

| No. | Composition (mass %) | | | | Consolidation temperature (° C.) | Number of particles (Relative value) | Lattice constant | Ni-based compound | Crystalline grain diameter (Relative value) | Notes |
|---|---|---|---|---|---|---|---|---|---|---|
| | W | P | Zr | Ni | | | | | | |
| 1 | 20 | 0.1 | 0 | Balance | 1100 | 100 | 3.61 | Good | 100 | Present |
| 2 | 15 | 1 | 0 | Balance | 1000 | 100 | 3.59 | Good | 70 | Inv. Ex. |
| 3 | 10 | 5 | 0 | Balance | 800 | 130 | 3.57 | Good | 60 | |
| 4 | 5 | 10 | 0 | Balance | 750 | 180 | 3.57 | Fair | 40 | |
| 5 | 15 | 0 | 0.1 | Balance | 1050 | 100 | 3.59 | Good | 60 | |
| 6 | 10 | 0 | 1 | Balance | 1000 | 120 | 3.57 | Good | 50 | |
| 7 | 5 | 0 | 5 | Balance | 950 | 120 | 3.57 | Good | 40 | |
| 8 | 1 | 0 | 10 | Balance | 900 | 170 | 3.56 | Fair | 30 | |
| 9 | 10 | 1 | 1 | Balance | 850 | 120 | 3.58 | Good | 70 | |
| 10 | 0.1 | 3 | 1 | Balance | 800 | 150 | 3.51 | Good | 50 | Comp. |
| 11 | 0.5 | 1 | 1 | Balance | 800 | 110 | 3.51 | Good | 60 | Ex. |
| 12 | 25 | 0.5 | 0 | Balance | 1100 | 160 | 3.64 | Fair | 100 | |
| 13 | 12 | 0 | 0 | Balance | 1000 | 100 | 3.57 | Good | 500 | |
| 14 | 12 | 0.05 | 0 | Balance | 1000 | 100 | 3.57 | Good | 420 | |
| 15 | 12 | 0 | 0.05 | Balance | 1000 | 100 | 3.57 | Good | 390 | |
| 16 | 12 | 6 | 6 | Balance | 1000 | 240 | 3.60 | Poor | 30 | |
| 17 | 12 | 1 | 1 | Balance | casting | 900 | 3.58 | Good | 70 | |

Note:
Underlined figures are out of the conditions of the present invention.

As shown in Table 1, Nos. 1 to 9 are present invention examples and Nos. 10 to 17 are comparative examples.

Comparative example No. 10 has a small lattice constant due to the low W content. Comparative example No. 11 has a small lattice constant due to the low W content similarly to No. 10. Comparative example No. 12 has a large lattice constant due to the high W content. In addition, the sample has a small amount of Ni-based compound generated or is partially amorphous. Comparative example No. 13 has a large crystalline grain diameter because this does not contain any of P and Zr. Comparative example No. 14 has a large crystalline grain diameter because the content of either or both of P and Zr is low.

Comparative example No. 15 has a large crystalline grain diameter because the content of either or both of P and Zr is low. Comparative example No. 16 has a large number of particles and has a large amount of Ni-based compound generated or is substantially amorphous because the content of both of P and Zr is high. Comparative example No. 17 is made by casting and has a large number of particles. In contrast, it is shown that any one of the properties is excellent in present invention examples Nos. 1 to 9, since they all satisfy the conditions of the present invention.

As mentioned above, the size of the crystalline grain of the Ni—W-based thin film can be reduced and the lattice constant of the sputtered thin film can be made between 3.53 ($\times 10^{-10}$ m) and 3.61 ($\times 10^{-10}$ m) by adding P and/or Zr to the Ni—W-based thin film which is used as the intermediate layer film of the perpendicular magnetic recording medium. Furthermore, the raw material powder produced by the gas atomization process does not form a coarse crystalline compound because the powder is quenched and solidified during the gas atomization process. The sputtering target material consolidated by using this powder provides excellent advantage such as less particle generation.

Example 2

The Ni—W—(Si, B)-based alloy powder shown in Table 2 was prepared by gas atomization. Using this powder as the raw material powder, the powder-filled billet sealed in an SC can under evacuation was consolidated by the HIP method and the upset method at 750 to 1300° C., and was machined to produce a sputtering target material of a Ni—W—(Si, B)-based alloy. In addition, another sputtering target material of a Ni—W—(Si, B)-based alloy was produced by a casting method for comparison.

The detail of the above-mentioned each step is as follows. First, 25 kg of the raw material was induction-melted in Ar in an alumina crucible and tapped through the tapping nozzle with a diameter of 5 mm provided at the bottom of the crucible at 1700° C. to produce a powder by Ar gas atomization at an atomization pressure of 0.7 MPa. The resultant Ni—W alloy powder was sealed in an SC can with an outer diameter of 205 mm, an inner diameter of 190 mm and a length of 300 mm under evacuation. The ultimate vacuum pressure at the evacuation was set at about $1.3 \times 10^{-2}$ Pa (about $1 \times 10^{-4}$ Torr). The above-mentioned powder-filled billet was consolidated by the HIP method at 750 to 1200° C. and 147 MPa.

After heating at 900 to 1350° C., the above-mentioned powder-filled billet was loaded in a constraint-type container with a diameter of 215 mm and consolidated at a pressure of 500 MPa. The consolidated ingot produced as mentioned above was processed to a disc with a diameter of 76.2 mm and a thickness of 3 mm by wire cutting, lathe machining and flat surface polishing, followed by brazing with a copper backing plate to make a sputtering target material.

Meanwhile, using the casting method, 100 kg of the raw material was melted under vacuum and casted to a refractory body with a diameter of 210 mm, which was turned off to a diameter of 200 mm and a length of 100 mm, followed by hot forging at 850° C. to a height of 50 mm. The subsequent method to produce the sputtering target material was similar to the above-mentioned the HIP and upset method.

As the items and methods of evaluation of the sputtering target material produced by the above-mentioned procedure, the expansion of the billet upon consolidation was evaluated as the appearance of the billet after HIP for the HIP method. In addition, the upset method was evaluated as the appearance upon heating of the billet. The results are shown as follows: Good: no expansion; Poor: presence of expansion. In addition, the relative density of the sputtering target material was calculated as the ratio of the density measured by the volumeweight method using a disc with a diameter of 76.2 mm and a thickness of 3 mm prepared by the above-mentioned method to the theoretical density calculated from the composition.

In addition, the sputtering target material prepared was sputtered onto an Si substrate with a diameter of 63.5 mm in order to evaluate the number of particles of the sputtered film. The sputtering conditions included the Ar pressure of 0.5 Pa, DC electric power of 500 W, and the film thickness of 500 nm. The number of particles generated under these conditions was measured. Note that the number of particles in Table 2 was expressed by the relative value to the number of particles of No. 1 which was taken as 100. In addition, the lattice constant of the sputtered film was calculated from the diffraction peak of the X-ray diffraction of the above-mentioned sputtered film.

Furthermore, the generation of the Ni-based compound was also confirmed and was evaluated as follows: Good: No Ni-based compound; Fair: A small amount of Ni-based compound generated; Poor: A large amount of Ni-based compound generated. The crystalline grain diameter of the sputtered film was measured by TEM observation of the cross section of the above-mentioned sputtered film. The diameter of a circle for the corresponding area was taken as the diameter of the crystalline grain by an image analysis. Note that the crystalline grain diameter in Table 2 was expressed by the relative value to the crystalline diameter of No. 1 which was taken as 100. Smaller value means a smaller crystalline grain diameter.

density due to the low consolidation temperature. In comparative example 14, the billet was expanded after HIP due to the high consolidation temperature, and it was thus difficult to perform processing to a sputtering target material having a density suitable for practical use, resulting in failure to conduct investigation. Comparative example 15 has a somewhat small lattice constant due to the absence of W as the component. Comparative example No. 16 has a somewhat large lattice constant due to the high content of W as the component.

Comparative example No. 17 has a coarse crystal grain size due to the absence of Si and B as the component. Comparative example No. 18 has a small effect of reducing the crystalline grain and the crystal grain size is coarse due to the low total content of Si and B as the component. Comparative example No. 19 generated a large amount of Ni-based compound and a large number of particles due to the high total content of Si and B as the component. In contrast, it is shown that any one of the properties is excellent in present invention examples Nos. 1 to 11, since they all satisfy the conditions of the present invention.

As mentioned above, by combined addition of a trace amount of Si and B to the conventional Ni—W binary component, a large number of the growth nuclei of the crystalline grain is formed upon solidification, eventually resulting in the fine crystalline grain. Consequently, the thin film of the fine crystalline grain can be produced and the perpendicular magnetic recording medium with the good recording properties can be obtained by using this film as the intermediate layer.

TABLE 2

| No. | Composition (mass %) | | | | Consolidation method | Consolidation temp. (° C.) | Expansion of billet | Relative density | Number of particles (relative value) | Lattice constant | Ni-based compound | Crystalline grain diameter (relative value) | Notes |
|---|---|---|---|---|---|---|---|---|---|---|---|---|---|
| | W | Si | B | Ni | | | | | | | | | |
| 1 | 12 | 0.05 | 0.05 | Bal. | upset | 1000 | Good | 99.4 | 100 | 3.57 | Good | 100 | Present Inv. Ex. |
| 2 | 12 | 0.5 | 1 | Bal. | upset | 900 | Good | 99.8 | 100 | 3.57 | Good | 80 | |
| 3 | 12 | 1 | 2 | Bal. | upset | 900 | Good | 100 | 130 | 3.58 | Good | 60 | |
| 4 | 12 | 3 | 4 | Bal. | upset | 1100 | Good | 100 | 130 | 3.58 | Good | 70 | |
| 5 | 12 | 6 | 4 | Bal. | upset | 1000 | Good | 99.6 | 180 | 3.59 | Fair | 60 | |
| 6 | 1 | 1 | 1 | Bal. | HIP | 800 | Good | 99.0 | 130 | 3.53 | Good | 90 | |
| 7 | 5 | 1 | 1 | Bal. | HIP | 1000 | Good | 99.8 | 120 | 3.55 | Good | 80 | |
| 8 | 10 | 1 | 1 | Bal. | HIP | 900 | Good | 99.2 | 100 | 3.57 | Good | 80 | |
| 9 | 20 | 1 | 1 | Bal. | HIP | 1250 | Good | 100 | 180 | 3.60 | Good | 80 | |
| 10 | 10 | 1 | 5 | Bal. | HIP | 1000 | Good | 99.7 | 120 | 3.59 | Fair | 150 | |
| 11 | 10 | 5 | 0.1 | Bal. | HIP | 1000 | Good | 99.8 | 180 | 3.57 | Fair | 180 | |
| 12 | 12 | 1 | 1 | Bal. | casting | | | 100 | 750 | 3.58 | Good | 100 | Comp. Ex. |
| 13 | 1 | 1 | 1 | Bal. | HIP | 750 | Good | 97.1 | 150 | 3.53 | Good | 90 | |
| 14 | 1 | 1 | 1 | Bal. | HIP | 1350 | Poor | difficult to investigate | | | | | |
| 15 | 0 | 1 | 1 | Bal. | HIP | 800 | Good | 99.7 | 100 | 3.51 | Fair | 80 | |
| 16 | 25 | 1 | 1 | Bal. | HIP | 1050 | Good | 99.2 | 170 | 3.62 | Good | 80 | |
| 17 | 12 | 0 | 0 | Bal. | HIP | 1000 | Good | 100 | 180 | 3.59 | Good | 400 | |
| 18 | 12 | 0.03 | 0.05 | Bal. | HIP | 1000 | Good | 100 | 120 | 3.59 | Good | 250 | |
| 19 | 12 | 5 | 8 | Bal. | HIP | 1000 | Good | 100 | 240 | 3.59 | Poor | 100 | |

Note:
Underlined figures are out of the conditions of the present invention

Nos. 1 to 11 shown in Table 2 are present invention examples and Nos. 12 to 19 are comparative examples.

As shown in Table 2, comparative example No. 12 is made by the casting method and has a large number of particles. Comparative example No. 13 has a somewhat low relative

The invention claimed is:
1. A sputtering target material for producing an intermediate layer film of a perpendicular magnetic recording medium, consisting of, in at %, 1 to 12% of W; 0.1 to 10% Zr; and balance Ni.

2. A sputtering target material for producing an intermediate layer film of a perpendicular magnetic recording medium, consisting of, in at %, 1 to 12% of W; 0.1 to 10% of Zr+P; and balance Ni.

* * * * *